United States Patent [19]

Anantha et al.

[11] 4,389,294

[45] Jun. 21, 1983

[54] METHOD FOR AVOIDING RESIDUE ON A VERTICAL WALLED MESA

[75] Inventors: Narasipur G. Anantha, Hopewell Junction; Harsaran S. Bhatia, Wappingers Falls, both of N.Y.; John L. Mauer, IV, South Kent, Conn.; Homi G. Sarkary, Hopewell Junction, N.Y.

[73] Assignee: International Business Machines Corporation, Armonk, N.Y.

[21] Appl. No.: 279,129

[22] Filed: Jun. 30, 1981

[51] Int. Cl.³ .............................................. C23C 15/00
[52] U.S. Cl. .................................. 204/192 E; 148/1.5; 148/187; 148/188
[58] Field of Search .................... 204/192 E; 148/1.5, 148/187, 188

[56] References Cited

U.S. PATENT DOCUMENTS

| 3,880,684 | 4/1975 | Abe | 204/192 E |
| 3,918,149 | 11/1975 | Roberts | 204/192 E |
| 4,007,104 | 2/1977 | Summers et al. | 204/192 E |
| 4,035,276 | 7/1977 | Havas et al. | 204/192 E |
| 4,073,054 | 2/1978 | Kaji et al. | 204/192 E |
| 4,076,680 | 2/1978 | Kuroda | 204/192 E |
| 4,117,301 | 9/1978 | Goel et al. | 204/192 E |
| 4,135,998 | 1/1979 | Gniewek et al. | 204/192 E |
| 4,181,564 | 1/1980 | Fogarty | 204/192 E |
| 4,326,936 | 4/1982 | Jones | 204/192 E |

OTHER PUBLICATIONS

Eames et al., IBM Technical Disclosure Bulletin, 22(1979) #7 p. 2739.
Bondur et al., IBM Tech. Disc. Bull., 19(1977) #9 p. 3413, pp. 3415–3416.
Bennett et al., IBM Tech. Disc. Bull., 24(1981), p. 2857.

Primary Examiner—Arthur P. Demers
Attorney, Agent, or Firm—Joseph E. Kieninger

[57] ABSTRACT

A method for eliminating deposited residues, for example polysilicon residue, on vertical silicon dioxide sidewalls that have been reactive ion etched includes reshaping the sidewalls to have a slope of at least +30° relative to the vertical direction of the sidewall.

7 Claims, 20 Drawing Figures

METHOD FOR AVOIDING RESIDUE ON A VERTICAL WALLED MESA

DESCRIPTION

TECHNICAL FIELD

The present invention relates to an improved method for fabricating a semiconductor device provided with recessed regions of dielectric material for isolating individual elements of the device and, more particularly to a method of forming deep dielectric isolation zones or regions wherein the improvement is forming emitter-butted transistors that do not have high leakage and forming resistor circuits that do not short out.

BACKGROUND ART

In the monolithic integrated circuit technology, it is usually necessary to isolate various active and passive elements from one another in the integrated circuit structure. These devices have been isolated by back biasing, PN junctions, partial dielectric isolation and complete dielectric isolation. The dielectric materials used in dielectric isolation techniques have been silicon dioxide, glass, and so forth. The preferred isolation for these active devices and circuits is some form of dielectric isolation. Dielectric isolation in integrated circuit devices has a substantial advantage over the PN junction isolation because potentially it allows the butting of the circuit elements against the isolation regions and thereby achieves greater density of packing of the active and passive devices on the integrated circuit device.

One form of dielectric isolation involves the formation of grooves or depressions in silicon where the isolation regions are to be formed. During the groove formation, the remainder of the silicon surface is protected by a protective film which is substantially unaffected by the silicon etch used to form the grooves and also to an oxidizing environment. The usual protective layer is a silicon nitride, silicon dioxide, sandwich layer. Following the formation of the grooves by conventional chemical etching, the silicon body is subjected to a conventional oxidation step whereby the silicon in the groove area is oxidized and the silicon dioxide fills up the groove as well as oxidizing further into the silicon to form the isolation region. One of the major problems with this process is what is known as "bird's beak."

The "bird's beak" is a nonplanar silicon dioxide formation at the top periphery of the groove and is caused by the lateral oxidation underneath the silicon nitride layer. Since the oxidation of a specific thickness of silicon requires an almost equivalent amount of free space to expand into, and since the $Si_3N_4$ limits the unrestricted expansion, the result is an up-pushing of the silicon nitride at the edge of the groove. The final consequence of this is a general stress in the perimeter region of the groove as well as difficulties in subsequently achieving good butted diffusions against the vertical portion of the silicon dioxide. This non-butting capability defeats a major benefit of the original purpose of the silicon dioxide region. Emitter-butted transistors that do not leak and resistors that do not short are a major problem. This process is described more fully by E. Kooi U.S. Pat. No. 3,970,486, Clevenger U.S. Pat. No. 3,534,234, Peltzer U.S. Pat. No. 3,648,125 and I. Magdo et al, patent application Ser. No. 150,609, filed June 7, 1971.

Another technique for forming dielectric isolation is described in the V. Y. Doo U.S. Pat. No. 3,386,865 and "A Composite Insulator-Junction Isolation" by R. E. Jones and V. Y. Doo, published in Electrochemical Technology, Vol. 5, No. 5–6, May–June 1967, pp. 308–310. This technique involves the formation of a silicon dioxide layer or similar type of layer on the substrate in the region where dielectric isolation is desired. An epitaxial layer is grown upon the substrate in all regions except where the silicon dioxide is located leaving openings over the silicon dioxide. The surface of the epitaxial layer and the sides of the resultant openings are partially thermally oxidized. The openings are partially thermally oxidized. The openings are then filled by vapor deposition of polycrystalline silicon, silicon dioxide or similar materials. This technique has some disadvantages. Selective epitaxy, as required by this technique, is very sensitive to the area relationship between silicon dioxide and silicon regions. For example, two different size silicon regions would tend to fill in at a different rate so that at the end of a process the regions are filled in to a different extent. Also, in mesa-type depositions, crystallographic faceting tends to occur. This results in pyramid-like growth and tends to widen the isolation regions beyond the original lithography capabilities. The slanted silicon/silicon dioxide interface will again cause difficulties in achieving reliable butted diffusions against the silicon dioxide region. Emitter-butted transistors that do not leak and resistors that do not short are a major problem.

The formation of grooves and the filling of such grooves have been described by other publications such as the G. L. Kuhn, U.S. Pat. Nos. 3,892,608 and 3,969,168. In these patents, chemical etching is used to form a V groove, a rounded bottom groove, or a rectangular evacuated space. There is little detail as to how the groove is formed but it is clear that the groove would be limited by the nature of the chemical etching step. The process does not necessarily yield a planar surface and it requires photolithography after the formation of the grooves. D. K. Roberson U.S. Pat. No. 3,956,033 describes a similar chemical etch followed by filling with polycrystalline silicon. Here again, the groove is limited by the chemical etching technique and it is unclear how the overgrowth of the polysilicon is removed. U.S. Patents K. E. Bean et al U.S. Pat. No. 3,725,160 and W. R. Morcom et al U.S. Pat. No. 3,979,237 also show filling of grooves. In these patents, the effect of chemical etching is more clearly brought out where it is shown that monocrystalline silicon are preferentially etched chemically to provide grooves having symmetrical sidewalls sloped at precise angles depending upon the particular face crystal to which the silicon surface is aligned.

U.S. Pat. Nos. 4,104,086 and 4,016,077 both disclose processes for forming deep recessed oxide isolation regions in a silicon substrate wherein grooves are formed in a silicon substrate wherein grooves are formed in the substrate using reactive ion etching, a layer of $SiO_2$ formed on the surface to fill the grooves, and the $SiO_2$ layer subsequently removed everywhere on the surface except where the material is disposed in the grooves.

Other methods for forming highly dense and very small, integrated semiconductor devices are described in H.B. Pogge, U.S. Pat. No. 4,256,514; I. T. Ho et al, U.S. Pat. No. 4,209,350; and J. Riseman, U.S. Pat. No. 4,234,362. The one micrometer technology, deep and shallow trench technology and polybase technology described in these patents provide lower collector-isolation capacitance, lower collector-base capacitance, lower base resistance and low diffusion capacitance. However, emitter-butted devices formed by this technology have high leakage and resistors butted against these trenches or mesas cannot be fabricated without adding an extra mask because of what is known as a "side rail" effect. Side rails are thin regions of doped polysilicon on the vertical sides of the mesas that are not removed in the reactive ion etching step which is used to remove the polysilicon. It is to be noted that some of these patents describe mesa sidewalls that are substantially vertical and cannot be more than 5° from the vertical.

SUMMARY OF THE INVENTION

It is an object of this invention to provide a method for avoiding the residue on vertical silicon dioxide walls in a semiconductor device after reactive ion etching.

It is another object of this invention to eliminate siderail effects of deep dielectric isolation zones or regions.

It is another object of this invention to provide a method for making emitter-butted transistors with reduced leakage.

It is yet another object of this invention to provide resistors that do not short out.

It is still another object of this invention to provide a method for avoiding the residue on vertical silicon dioxide walls in openings of a silicon dioxide layer after reactive ion etching.

These and other objects are accomplished by a method that includes reshaping the sidewalls to have a slope of at least +30° relative to the vertical direction of the sidewall. The sloped sidewalls eliminate the deposited polysilicon residue on the vertical silicon dioxide sidewalls that have been reactive ion etched. One non-limiting example of this method is to ion mill the top portion of a silicon dioxide mesa sidewall that is used in deep dielectric dilation devices so that the exposed portion of the mesa sidewall is at an angle of, for example 30 to 45°, from the vertical direction.

Other objects of this invention will be apparent from the following detailed description, reference being made to the accompanying drawings wherein specific embodiments of the invention are shown.

DESCRIPTION OF THE ILLUSTRATIVE EMBODIMENT

Figure 1A:
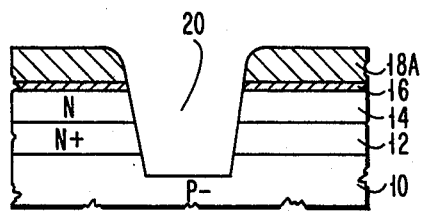
FIGS. 1A through 1G are cross-sectional views of devices made by one method in accordance with this invention.

Referring now particularly to FIG. 1A through FIG. 1E, the manufacturing steps for forming recessed oxide region in a semiconductor device in accordance with this invention are illustrated. The structure illustrated in FIG. 1A includes a monocrystalline silicon substrate 10, which is shown as P− conductivity for illustration purposes, with an N+ layer 12 over substrate 10 and an N− conductivity layer 14 on layer 12. For the purposes of the invention, either all or some of the regions or layers 10, 12 and 14 could be of opposite conductivity from the conductivity types indicated. However, it is preferred to have the layer 12 be a high conductivity region where it will ultimately be the collector of a bi-polar transistor. This structure can be fabricated by various techniques. However, the preferred technique is to provide a P-monocrystalline silicon substrate and diffuse an N+ blanket diffusion into the substrate by using conventional diffusion or ion implantation of an N type impurity such as arsenic, antimony or phosphorous to produce the N+ region with a surface concentration of between $1 \times 10^{19}$ and $1 \times 10^{21}$ atoms per cc. The layer 14 is subsequently grown onto substrate 10 over layer 12 by means of epitaxial growth. This may be done by conventional techniques such as the use of $SiCl_4/H_2$ to $SiH_4/H_2$ mixtures at growth temperatures of about 1000° C. to 1200° C. The N+ layer may have a typical thickness of between 1 to 3 microns, whereas the epitaxial layer has a thickness of from 0.5 to 10 microns, the exact thickness depending upon the device to be built.

Alternately, the structure could be made by various combinations of thermal diffusions, ion implantations and/or epitaxial growth which would include the formation of a buried sub-collector region where the subsequent formation of bi-polar devices is desired.

A silicon dioxide layer 16 is formed by conventional techniques of either thermal growth in a wet or dry oxygen ambient or by chemical vapor deposition. The thickness of layer 16 can be any suitable thickness typically between 250 to 10,000 A, more preferably 1,000 to 3,000 A. A layer of polysilicon 18 is deposited over $SiO_2$ layer 16 using conventional techniques. The polysilicon layer 18 can be deposited with the same apparatus used to form epitaxial layer 14, described previously or by any conventional deposition technique. In general, the thickness of layer 18 will be in the range of 0.2 to 1.5 microns for typical device application.

In order to form recessed oxide regions in a device, trenches or grooves 20 must be formed to a depth sufficient to reach through N+ region 12. These grooves 20 can be formed by any suitable technique, but are preferably formed by reactive ion etching. Techniques for forming grooves in a semiconductor by reactive ion etching techniques are described in Hochberg U.S. Pat. No. 3,966,577 and T. Kaji et al U.S. Pat. No. 3,997,378, and S.A. Abbas, IBM TDB Vol. 20, No. 1, P. 144 June 1977 entitled *Recessed Oxide Isolation Process*. A particularly advantageous process for etching silicon is described in J. M. Harvilchuck et al's patent application Ser. No. 594,413, filed July 9, 1975, for "Reactive Ion Etching of Silicon." In order to form grooves 20, a suitable mask is formed on the top surface of polysilicon layer 18A and the substrate exposed to reactive ion etching. A typical technique for forming a mask is to oxidize the surface of polysilicon layer 18A and remove portions thereof by conventional photolighographic techniques overlying the areas where trenches are desired. The masking layer is not illustrated since it is conventional in the art. Trenches 20 are then formed resulting in the cross-section shown in FIG. 1A. The depth of the trenches must be sufficient to extend beneat N+ diffused region 12 in FIG. 1A.

Figure 1B:
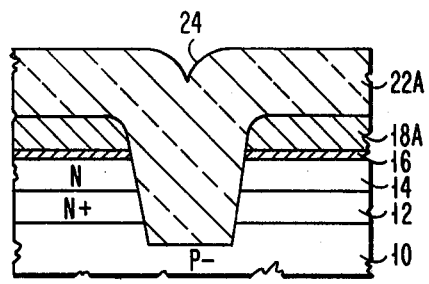
Figure 1C:
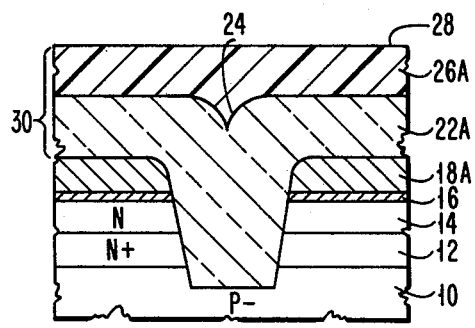

As illustrated in FIG. 1B, the next step in the process is filling the grooves 20 with a suitable dielectric material. In order to completely fill the groove 20, a blanket layer 22A of dielectric material must have a thickness at least one-half the width of the groove 20 or equal to the depth of the groove 20, whichever is appropriate. A preferred dielectric material for filling groove 20 is $SiO_2$ deposited by a chemical vapor deposition technique using gas mixtures of $CO_2/SiH_4/N_2$ or $N_2O/SiH_4/N_2$ at 800°–1000° C. Typical deposition rates are of the order of 50 to 200 A per minute and the total deposition thickness is at least one-half the width of groove 20. The width of groove 20 varies typically from 0.1 um to 500 um and the depth of groove 20 varies typically from 0.2 um to 10 um.

Depending upon the depth and the width of groove 20, a depression or cusp 24 is formed on the surface over the filled channel 20. If a uniform surface thickness is removed from layer 22, the depression 24 will be propulgated downwardly and appear in the surface of the device. The depression can cause problems in fabricating the necessary metallurgy on the finished device. In order to eliminate the depression 24, a layer 26 of material is flowed over the surface to fill in the depression 24 to achieve a relatively planar surface 28. Layer 26 is preferably a layer of organic material such as polyimide resin, or a suitable resist material. The thickness can be any suitable thickness, preferably from 1 to 3.0 microns.

Figure 1D:
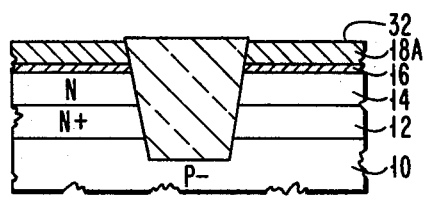

As indicated in FIG. 1D, layers 26, 22 and a portion of 18 are removed leaving the trench 22 filled with dielectric material which will serve as isolation regions encircling monocrystalline device regions to provide electrical isolation between associated elements on the same substrate. This removal step is accomplished by reactive ion etching of layer 26, layer 22 and a portion of layer 18. The system used for this process is preferably a low pressure sputter etch system with the substrate positioned on a silicon cathode cover plate. A fluorinated hydrocarbon such as $CF_4$ is used as an etchant so that the organic material/$SiO_2$/Si etch rate ratio of approximately 1 to 1 to 1 results. The gas pressure could run from 10 to 70 micrometers with gas flow rates of 2 to 50 cc/min. The RF power level is preferably from 0.2 watts/$cm^2$ to 0.5 watts/$cm^2$. The reactive ion etching operation thus starts with a relatively smooth surface 28 and maintains this surface as the layers are progressively etched away, since the etch rates of Si, $SiO_2$ and polyimide are approximately the same. The new surface 32 after reactive ion etching is indicated in FIG. 1D.

Figure 1E:
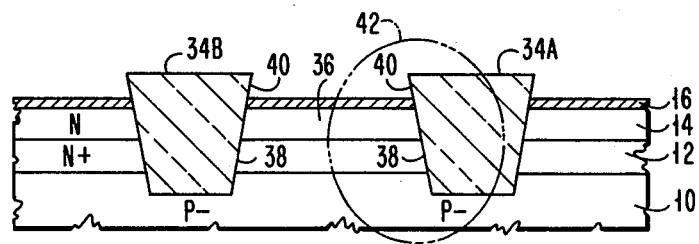

The next step in forming the recessed regions is removal of the remaining polysilicon material of layer 18 as shown in FIG. 1E. In order to remove the polysilicon material, the substrate is exposed to an etchant that selectively etches only the polysilicon and not the silicon dioxide material. Such an etch is pyrocatechol. The pyrocatechol etchant will remove all of the polysilicon above the $SiO_2$ layer 16 in the cross-sectional view shown in FIG. 1E. Alternately, the remaining polysilicon material can be removed by reactive ion etching in an ambient that selectively removes silicon. Examples are: $SF_6$ with a polysilicon to oxide etchant ratio of 15:1 or $SF_6/Cl_2$ with a polysilicon to oxide ratio of 45:1 or $Cl_2$/Argon with a polysilicon to oxide etchant ratio of 6:1. As shown in FIG. 1E, there is a slight protrusion of recessed oxide or mesa regions 34A and B above the surface of layer 16. However, the top surface of mesa regions 34A and B are planar without the depression 24 present in the deposited layer 22.

Two oxide regions 34A and B are shown in FIG. 1E to point out that resistors in region 36 that abut against the mesa sidewalls 38 are frequently shorted by residue (not shown) on the mesa sidewall region 40. The residue typically remains from doped polysilicon which is subsequently deposited and removed from the rest of the device by reactive ion etching. Similarly, transistors with emitters abutting against the wall 38 frequently leak due to the above-mentioned residue on sidewall region 40. The region 42 of the device shown in FIG. 1E is enlarged and shown in FIG. 1F.

Figure 1F:
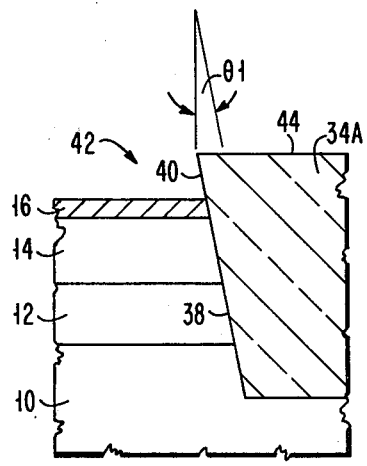

As shown in FIG. 1F, the mesa sidewall portion 40 forms an angle $\theta_1$ with a vertical line 42 in which the angle of $\theta_1$ is less than five degrees. In this case, we shall assign it a value of less than $-5°$.

In accordance with this invention, the mesa sidewall portion 40 is reshaped to form surface 40A. New mesa sidewall portion 40A slopes away from the end of the top surface 44 so that the angle $\theta_2$ is greater than $+30°$. The angle $\theta_2$ must be 30° or more to ensure that any residue on sidewall portion 40A is completely removed in a subsequent reactive ion etching step. By removing all of the residue from sidewall portion 40A, the emitter-butted transistors do not leak and the resistors in region 36 are not shorted out. The angle $\theta_2$ can be any angle from 30° to less than 90° where the upper value is limited by device geometry. As a practical limit, usually an angle on the order of about 70° is the upper limit.

Figure 1G:
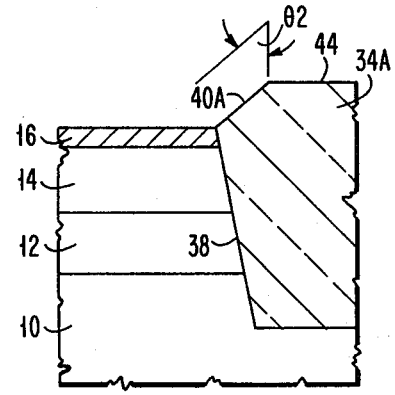

In FIG. 1G, the sidewall portion 40A was formed by ion milling. Ion milling restricts the upper limit of $\theta_2$ to about 45°, thereby resulting in a range of +30 to 45° for $\theta_2$. In general, it is preferred to make the angle 32 as large as possible so that the slope is shallow. Typically, $\theta_2$ is made as large as possible with the upper limit being determined either by the device geometry or by the method of forming the sloped wall.

Figure 2A:
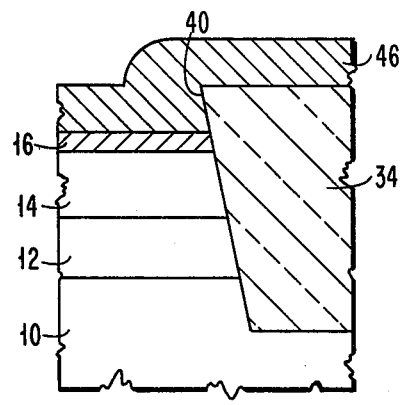
FIGS. 2A and 2B are cross-sectional views illustrating the second embodiment of this invention.
Figure 2B:
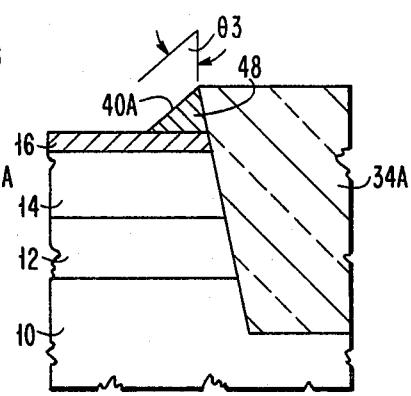

Another method of forming a sloped mesa sidewall 40A is shown in FIGS. 2A and 2B. As shown in FIG. 2A, a silicon dioxide chemical vapor deposited film 42 is formed on top of the mesa 34A and the silicon dioxide layer 16. The layer 42A is then reactive ion etched and it is all removed except for portion 44 having a sloped sidewall 40A. With this method the upper limit angle $\theta_3$ is of the order of 50°.

Figure 3A:
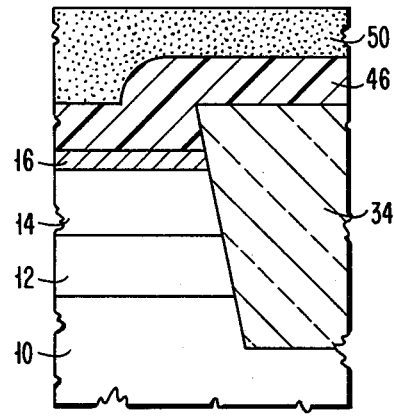
FIGS. 3A through 3C are cross-sectional views illustrating a third embodiment of this invention.
Figure 3B:
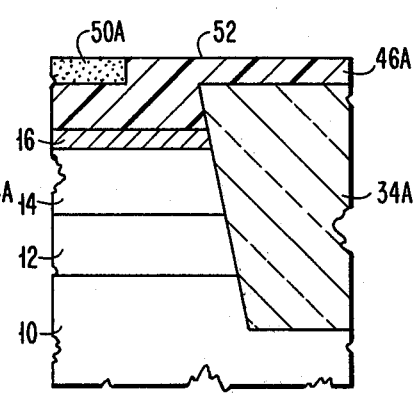
Figure 3C:
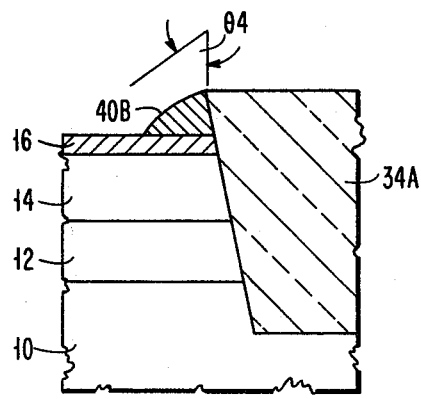

Another method is shown in FIGS. 3A through 3C where a silicon dioxide chemical vapor deposition film 46 is deposited as in FIG. 2A. On top of layer 46 is deposited a planarizing film 50. This planarizing film is preferably of a layer of organic material such as polyimide resin or a suitable resist material and is similar to layer 26 previously described. The device is then reactive ion etched until the films 46A and 50A form a planar surface 52. At that point, the reactive ion etch conditions are changed to remove the balance of the layer 46A from the top of the mesa 34A. The resultant mesa has a sloping sidewall portion 40B where the angle $\theta_4$ is from 30° to 70° or more. The upper limit in this case is determined by the device geometry. With this method the angle $\theta_4$ can be larger than with the two previous methods described.

Figure 4A:
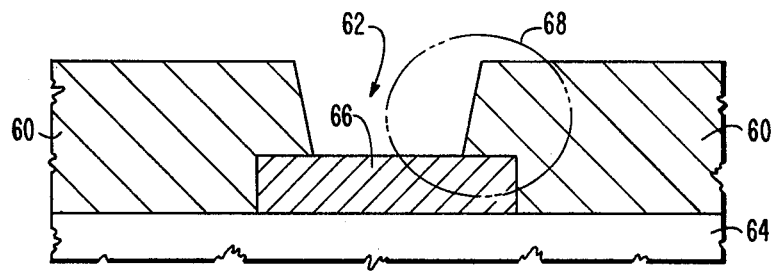
FIGS. 4A to 4D are cross-sectional views of a method in accordance with this invention to provide a via opening.
Figure 4B:
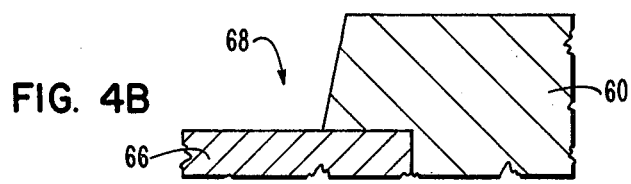
Figure 4C:
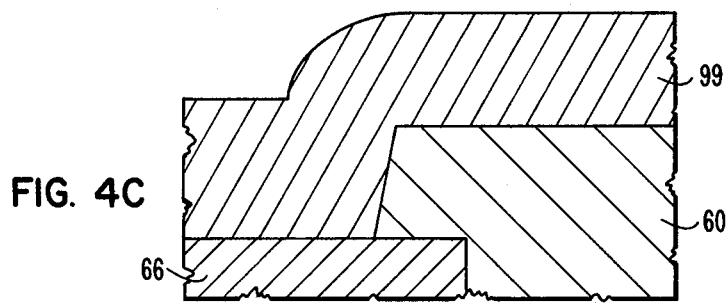
Figure 4D:
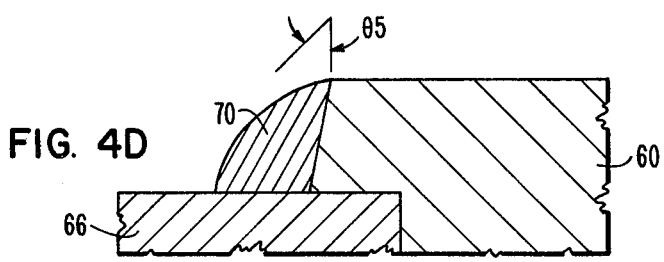

In accordance with this invention the method is also useful for removing the residue in via openings to a metal contact on a semiconductor device as shown in FIGS. 4A through 4D. A silicon dioxide layer 60 having an opening 62 therein is deposited on top of a semiconductor device 64 having a metal contact 66. The area 68 in FIG. 4A is enlarged and shown in FIG. 4B. As shown in FIG. 4C a layer 99 of chemical vapor deposited silicon dioxide is deposited on top of SiO$_2$ layer 60 and the metal film 66. The layer 68 is then reactive ion etched away to provide the layer 60 with a sloping edge that has an angle $\theta_5$ which is greater than 30°.

Figure 5A:
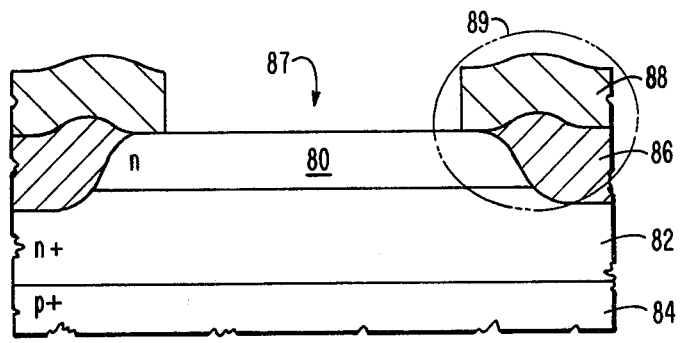
FIGS. 5A to 5D are cross-sectional views of a method in accordance with this invention to provide a contact opening.
Figure 5B:
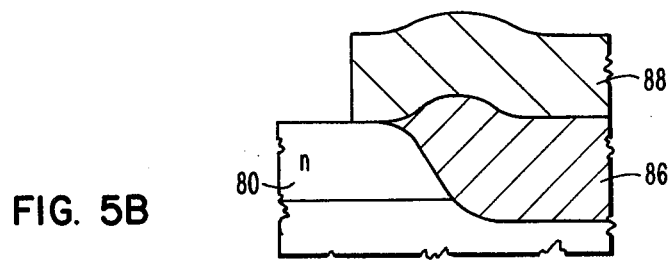
Figure 5C:
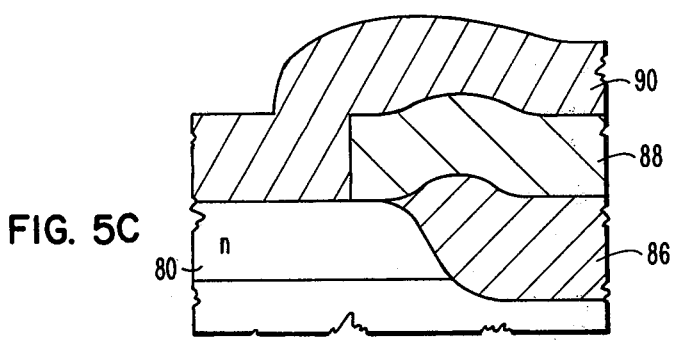
Figure 5D:
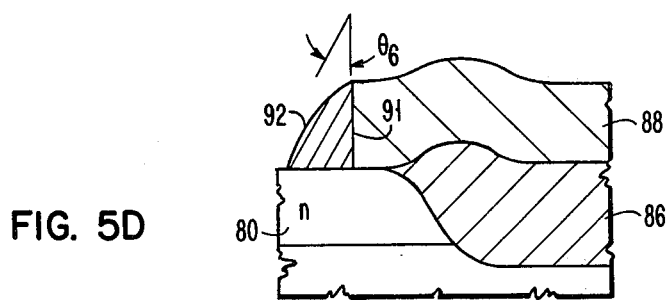

This invention is also useful to provide a contact opening to semiconductor devices as shown in FIGS. 5A through 5D. In FIG. 5A a semiconductor device having layers 80, 82 and 84 have SiO$_2$ layers 86 and 88 deposited thereon with a contact opening 87 to layer 80. The encircled region is shown in enlarged form in FIG. 5B. On top of the exposed layer 80 and the silicon dioxide layer 88 is deposited a layer 90 which is a chemical vapor deposited silicon dioxide film. This layer 90 is then reactive ion etched to form the structure shown in FIG. 5D where layer 88 now has had its sidewall 91 reshaped to have a new side 92. The reshaped wall 92 forms an angle $\theta_6$ which is greater than 30°.

Although a preferred embodiment of this invention has been described, it is understood that numerous variations may be made in accordance with the principles of this invention.

What is claimed is:

1. A method for avoiding residue on a vertical walled dielectric mesa of a layer to be deposited on said mesa and to be removed by reactive ion etching comprising the steps of
   providing a silicon substrate having said dielectric mesa on a surface thereof, and reshaping a wall of said dielectric mesa so as to be sloping at an angle equal to or greater than 30° relative to a line vertical to said surface of said substrate.

2. A method as described in claim 1 whereby the reshaping is accomplished by removing material from the wall of said mesa.

3. A method as described in claim 2 whereby the material is removed from the mesa by ion milling.

4. A method for avoiding residue on a vertical walled dielectric mesa of a layer to be deposited on said mesa and to be removed by reactive ion etching comprising the steps of
   providing a silicon substrate having said dielectric mesa on a surface thereof, reshaping a wall of said mesa so as to be sloping at an angle equal to or greater than 30° relative to a vertical line to said surface of said substrate,
   depositing said layer on said reshaped mesa, and removing said layer by reactive ion etching.

5. A method as described in claim 4 whereby a wall is reshaped by ion milling.

6. A method as described in claim 5 whereby the ion milling is performed so as to cause the wall to slope at an angle of 30° to 45°.

7. A method as described in claim 4 whereby polysilicon is deposited on said reshaped mesa.

* * * * *